United States Patent [19]

Fong et al.

[11] Patent Number: 5,153,507
[45] Date of Patent: Oct. 6, 1992

[54] MULTI-PURPOSE BOND PAD TEST DIE

[75] Inventors: Carl H. Fong, San Jose; William K. Shu, Sunnyvale, both of Calif.

[73] Assignee: VLSI Technology, Inc., San Jose, Calif.

[21] Appl. No.: 614,404

[22] Filed: Nov. 16, 1990

[51] Int. Cl.5 ..................... G01R 31/00; G01R 31/02
[52] U.S. Cl. .................................. 324/158 R; 357/65; 357/68; 437/8
[58] Field of Search ............... 324/158 R, 500, 537; 437/7, 8; 357/65, 68

[56] References Cited

U.S. PATENT DOCUMENTS

| 3,039,604 | 6/1962 | Bickel et al. | 324/158 F |
| 3,715,242 | 2/1973 | Daniel | 437/8 |
| 4,628,144 | 12/1986 | Burger | 357/68 |
| 4,778,771 | 10/1988 | Hiki | 437/8 |
| 4,833,513 | 5/1989 | Sasaki | 357/65 |
| 4,881,029 | 11/1989 | Kawamura | 324/158 R |
| 4,893,168 | 1/1990 | Takahashi | 357/68 |
| 4,959,706 | 9/1990 | Cusack et al. | 357/68 |
| 4,999,700 | 3/1991 | Dunaway et al. | 357/68 |

Primary Examiner—Kenneth A. Wieder
Assistant Examiner—William J. Burns
Attorney, Agent, or Firm—Majestic, Parson, Siebert & Hsue

[57] ABSTRACT

A novel test die is disclosed for use in conjunction with a semiconductor assembly machine or process. The test die includes a plurality of sets of bond pads having different bond pad pitches which permits testing of those pitches with use of a single die. Bond pads suitable for array bonding and having different bond pad pitches are also disclosed. Electrical connections are provided between bond pads and permit detection of open and short circuits or other circuit defects. A staggered arrangement of bond pads permits bond pads to be packed more densely on the die. A method for fabricating a wafer having a plurality of bond pads which form a repeating pattern is given. The patterned wafer may be cut to form a test die having bond pads which are positioned to provide bond pad pitches as required by a user.

23 Claims, 3 Drawing Sheets

MULTI-PURPOSE BOND PAD TEST DIE

BACKGROUND OF THE INVENTION

This invention relates to a novel semiconductor die. More specifically, this invention relates to a test die for evaluating a semiconductor assembly machine or process, and methods for making the die and for performing such evaluations by utilizing the test die.

In the semiconductor industry, assembly equipment and processes are evaluated prior to production commercial in order to maximize yield. A wafer sort prober electrically tests the integrity of the integrated circuits fabricated on the die. A test die is used in an assembly machine and then the machine, the wafer sort prober, and the die configuration are evaluated based on results obtained using the test die.

To illustrate the assembly process and components, shown in FIG. 1 is a silicon wafer 10 which may be cut into a plurality of dies 12. In a test die, bond pads are fabricated on the die with or without integrated circuits to permit testing of the arrangement of the bond pads and the performance of the assembly and wafer sort machines.

In order to form a usable package, a die is put on the central portion of a lead frame or the base of a package housing with leads, and each of the leads is electrically connected to a bond pad via a bonding wire by means of an assembly machine. A single die ready to be used in products has a plurality of bond pads on its surface. The distance between the center points of two adjacent bond pads is defined as the bond pad pitch.

Since different dies may have different bond pad pitches, a test die should be suitable for use in evaluating the effectiveness of an assembly machine or wafer prober on the die's bond pad pitch and the electrical integrity of the bond formed by the machine. As shown in FIG. 2, a bond ball 14 formed at the end of a bonding wire 15 descends upon a bond pad 16 layered on top of a polysilicon layer 20 and is then welded to the bond pad by use of an assembly machine. When too much force is applied to the assembly pad by a bond ball during the bonding process, the die may undesirably crack and crater 22 results.

In the past, test dies have included a plurality of bond pads having a uniform bond pad pitch fabricated on a single wafer. However, the use of a wafer dedicated to a particular bond pad pitch is costly because only a portion of the wafer may actually be utilized. A user would have to purchase many wafers having different bond pad pitches in order to test and evaluate the assembly and wafer sort machines or production process for a plurality of bond pad pitches.

The bond pad pitch of an actual device must be optimized with respect to an assembly machine, to accommodate the bond pads at the corners of the die and those that are not at the corners. FIG. 3 illustrates the connection of, for example, a set of corner bond pads 30 connected to leads 32 via bonding wires 34, and center bond pads 36 connected to leads as shown. Note that the distance between adjacent bonding wires connected to the set of center bond pads 36 is greater than the distance between adjacent bonding wires connected to the corner bond pads 30. Since the die is so small, there is the possibility that the bonding wires at the corners will undesirably contact one another and produce a short circuit.

With prior art test dies, it is difficult to verify open circuits or short circuits between adjacent bonding wires, and no effective method of determining the presence of cratering is available. Additionally, no effective method for evaluating array bonding has been discovered.

The difficulties in the preceding are not intended to be exhaustive but rather are among many which may tend to reduce the usefulness of prior art test dies. Other noteworthy problems may also exist; however, those presented above should be sufficient to demonstrate that test dies appearing in the past will admit to worthwhile improvement.

SUMMARY OF THE INVENTION

It is therefore a general object of the invention to provide a novel test die which will obviate or minimize difficulties of the type previously described.

It is a specific object of the invention to provide a test die which will minimize the need for a dedicated test die for testing each bond pad pitch on a die.

It is another object of the invention to provide a test die which will permit evaluation of the bond integrity formed by a bonding assembly machine.

It is still another object of the invention to provide a test die which will permit detection of the presence of open or short circuits formed by an assembly machine.

It is a further object of the invention to provide a test die which will evaluate the bond pad pitch and integrity of bonds formed on a die.

It is yet a further object of the invention to provide a test die which will evaluate array bonding.

It is still a further object of the invention to provide a test die which will permit detection of cratering.

It is yet another object of the invention to provide a test die which is cost effective and may be altered according to the specifications of a particular assembly machine.

It is yet still another object of the invention to provide a method for evaluating a semiconductor assembly machine.

One aspect of the invention which accomplishes at least some of the foregoing objects includes a test die having at least two sets of bond pads, each of the sets having at least two bond pads which are adjacent to each other. The distance between the center points of two adjacent bond pads is defined as the bond pad pitch. The sets of bond pads have different bond pad pitches.

A second aspect of the invention includes a test die having at least one group, also known as an array, of bond pads. The group has two sets of bond pads which lie on parallel lines. The two sets of bond pads have substantially the same bond pad pitch, which defines the bond pad pitch of the group. In the preferred embodiment, the test die has four groups of bond pads with each group having a different bond pad pitch.

A third aspect of the invention is directed to a test die having at least two bond pads which are adjacent to one another. An electrical connection is provided between the two pads such that external detection of open circuits is possible.

Another aspect of the invention includes a test die having two sets of octagonally shaped bond pads, each set lying on a straight line. In a preferred embodiment, the sets lie on lines which are parallel and adjacent to each other. A first set is closer to the edge of the die than a second set. The bond pads form a staggered arrangement such that the bond pads of the first set are offset from the bond pads of the second set so that the bonding wires bonded to the bond pads of the second set pass between the bond pads of the first set.

The invention also includes a method for evaluating a semiconductor assembly machine and includes the step of fabricating a wafer having a plurality of sectors. Each sector includes a plurality of bond pads which form a repeating pattern. A user identifies a desirable pattern of sectors and cuts the pattern apart from the wafer by a wafer saw operation to form an appropriately sized test die with corner bond pads of the desired bond pad pitch.

DESCRIPTION OF THE DRAWINGS

Other advantages of the present invention will become apparent from the following detailed description of a preferred embodiment thereof taken in conjunction with the accompanying drawings, wherein.

DETAILED DESCRIPTION OF THE INVENTION

Test Die

Figure 4:
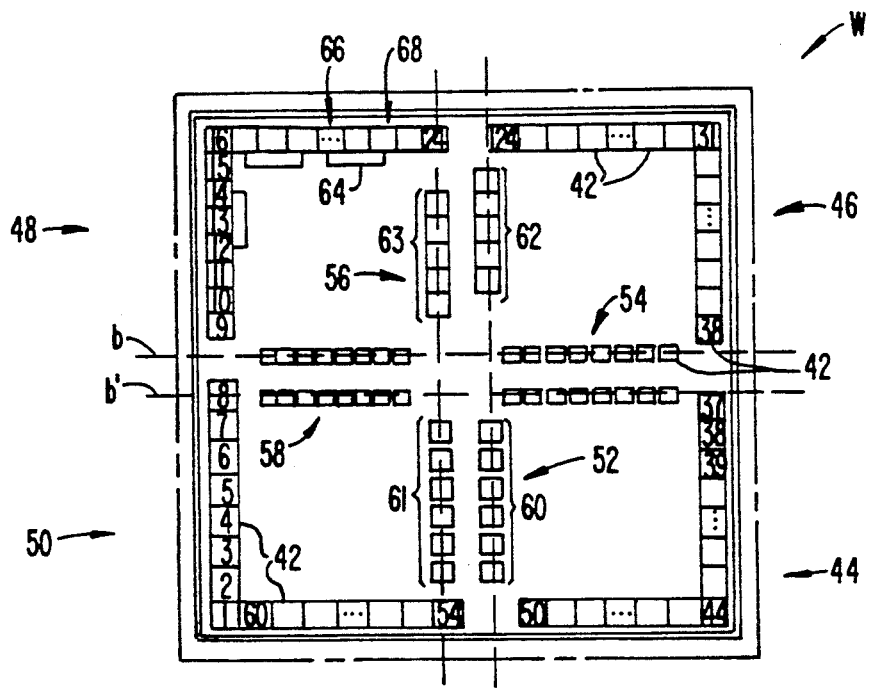
FIG. 4 is a plan view of a sector portion of a test die of the present invention showing an arrangement of bond pads.

Referring now to the drawings, wherein like numerals indicate like parts, and initially to FIG. 4, there will be seen a sector portion of a test die in accordance with a preferred embodiment of the present invention. More particularly, a sector portion of a test die 40 includes a plurality of bond pads 42 which are arranged in four sets 44, 46, 48, 50 at the corners of the die. Set 46, for example, includes the bond pads labelled 24–38 on the bond pads in FIG. 4. Four groups 52, 54, 56, 58 of arrays of bond pads are also shown.

The distance between the center points of two adjacent bond pads is defined as the bond pad pitch. Bond pad sets 44, 46, 48, 50 have different bond pad pitches a test die including the die sector portion of a test die 40 may be used to test four different bond pad pitches in conjunction with an assembly or wafer sort machine. A user may test all four sets of bond pads in order to determine the optimal bond pad pitch for a particular assembly machine, and therefore does not have to purchase or utilize separate wafers for the different bond pad pitches which are to be tested. Additionally, the use of four different bond pad pitches permits determination of optimal wire lengths which are to be used with a die and with the particular bond pad pitch chosen for an actual device.

After a test die 80 (FIG. 7) is used in the assembly machine, the test die 80 (FIG. 7) is examined and the integrity of wires and wire bonds (not shown) used to bond the leads (not shown) to the bond pads 42 (FIG. 4) may be evaluated. An optimal bond pad pitch may be determined for the bond pads at or near the corners, since the wires bonded at the corners are spaced closer together than those used to bond the leads to the bond pads not near the corner. The optimal length of the wires used to connect the die 80 (FIG. 7) to a lead frame (not shown) may also be evaluated.

The groups 52, 54, 56, 58 similarly provide four different bond pad pitches. Each group includes two sets of bond pads. For example, shown as part of group 52 are bond pad sets 60, 61, which lie on two parallel lines a, a' and have the same bond pad pitch. The bond pad pitch of the sets 60, 61 defines the bond pad pitch of the group 52. The bond pad pitches of groups 52, 54, 56, 58 are different to permit comparative evaluation of array bonding.

The groups are arranged so that the bond pads of groups 52, 56 lie on the pair of straight lines a, a'. The bond pads of groups 54, 58 lie on another pair of straight lines b, b' which are perpendicular to the lines a, a' of groups 52, 56. Additionally, the two sets of bond pads in each group may be positioned so that they are staggered from one another. For example, sets 62, 63 of group 56 each includes five bond pads which are offset from one another, as shown.

A sector portion of test die 40 includes a plurality of electrical connections between bond pads which are adjacent to each other and are arranged in an ordered sequence. An electrical connection between alternating bond pads is provided, such as connection or trace 64 connecting two bond pads 66, 68 with bond pad 70 between them. A testing machine utilizes the electrical connections to determine if open circuits are present. The connection does not prevent detection of short circuits, for example, between the bonding wires (not shown) connected to bond pads 68, 70. Bond pad 66, and therefore bond pad 68, is connected to ground (not shown). An ohmmeter is used to test the circuit and does so by applying a voltage across bond pads 70 and 66, and then measuring the resistance between the bond pads 70 and 66. If there is no short circuit present, the resistance measured will be high; a noticeably lower resistance indicates the presence of a short circuit or some other circuit defect, such as cratering. A similar method permits external detection of open circuits. More specifically, an ohmmeter is again used and applies a voltage across bond pads 66 and 68, and then measures the resistance. If no open circuits are present, the resistance will be quite low; a value of resistance which is higher than normal indicates the presence of an open circuit or some other circuit defect. The electrical connections, not all of which are shown, are made throughout the test die 40 and permit facile determination of the presence of open and short circuits or other circuit defects.

Figure 1:
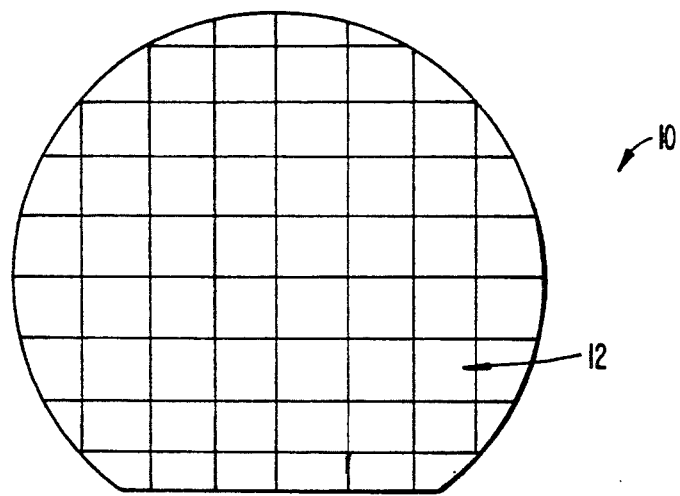
FIG. 1 is a plan view of a prior art silicon wafer divided into die sections prior to a wafer saw operation.
Figure 2:
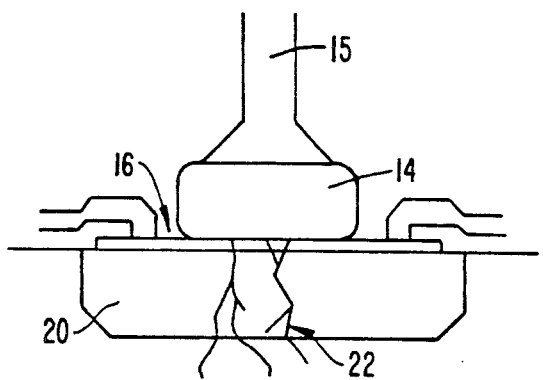
FIG. 2 is a cross section of a test die showing an overstressed bond ball on a bond pad and the resulting craters.
Figure 3:
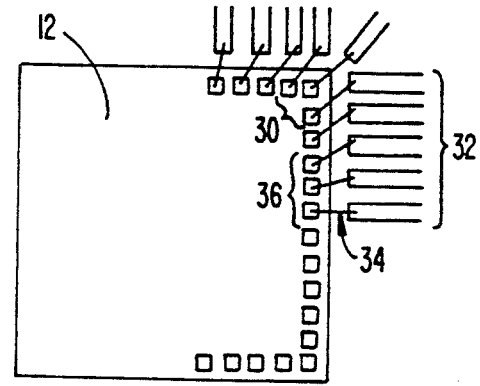
FIG. 3 is a plan view of a partial configuration of a prior art test die as it is connected to an adjacent lead frame.
Figure 5A:
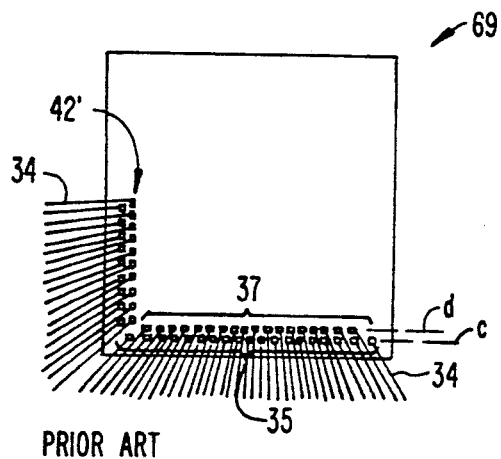
FIG. 5A is a plan view of a test die showing a second arrangement of bond pads.

FIG. 5A illustrates another test die 69 having bond pads 42'. Some of the bond pads 42' are arranged in a first set 35 positioned on a straight line c along the edge of the die and a second set 37 positioned on a straight line d on the inner portion of the die. The lines c and d are parallel to each other such that the bond pads form two parallel sets, as shown. The bond pads of second set 37 are offset from the pads of the first set 35 such that the bonding wires attached to the second set pass between the bonding wires and pads of the first set 35. The staggered bond pad arrangement increases the packing density of the bond pads and may thereby reduce the necessary size of a die. In an optimal arrangement, the bond pads are oriented so that the bonding wires 34 are at a constant distance from one another, thus achieving the highest packing density. The staggered bond pad arrangement may be used in a sector portion of a test die as shown in FIG. 4 such that the die has at its four corners four sets of staggered bond pads 42' of the type shown in FIG. 5A, each set having a different bond pad pitch.

Figure 5B:
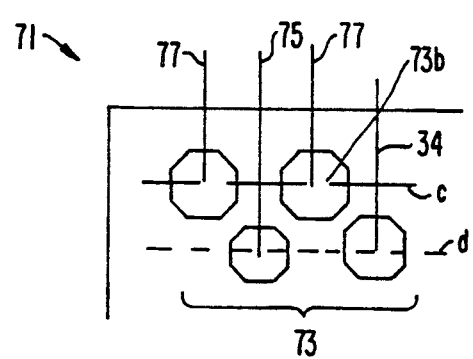
FIG. 5B is a more detailed plan view of a bond pad of the present invention in accordance with the embodiment of FIG. 5A.

FIG. 5B is a more detailed view of a staggered bond pad arrangement and shows a portion 71 of a die having staggered bond pads 73 which are octagonally shaped. The octagonal bond pads permit a higher packing density when used with a staggered arrangement. The bonding wire 75, connected to a bond pad which lies on line d, passes between bond pads 73a, 73b, which lie on line c. This arrangement permits bonding wires to be close together even when the size of the bond pads cannot be reduced.

Figure 6:
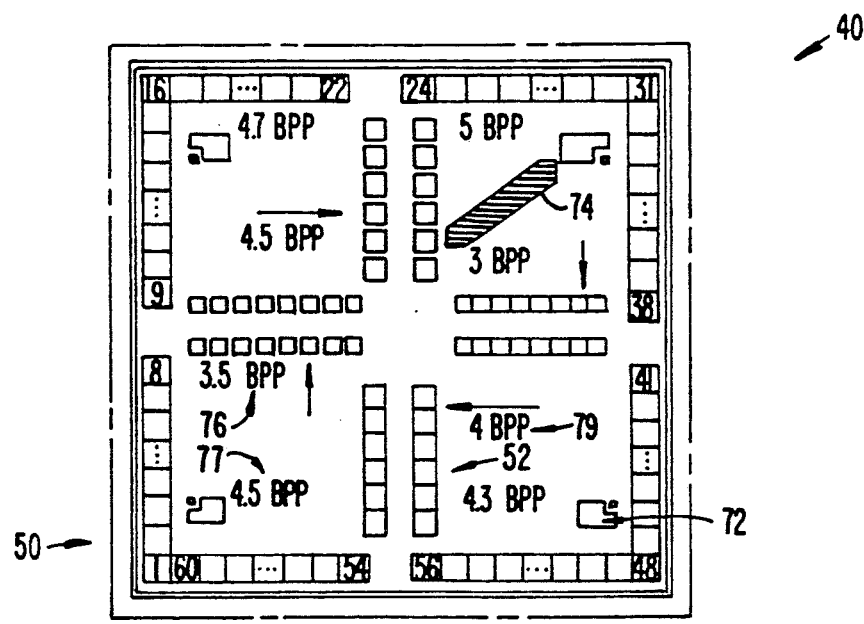
FIG. 6 is a plan view of a sector portion of a test die in accordance with the present invention.

FIG. 6 is a more detailed view of the sector portion of the test die 40 and shows four positioning markers 72, an identification marker 74, and a plurality of inscriptions 76. The positioning markers 72 have unique patterns which may be operably recognized by a semiconductor assembly or wafer sort machine or an operator to verify alignment, positioning or orientation of the die 40. The identification marker 74 permits an operator to identify a particular pattern of sectors or a single sector when a wafer is composed of a plurality of sectors which are adjacent to one another. The identification marker also facilitates separation of sectors into desired dies during a wafer saw operation.

The inscriptions 76 are fabricated using a mask and an etching process and facilitate evaluation of a test die after use in an assembly machine by identifying the bond pad pitch of a particular area of the test die 40. For example, the marking "4.5 BPP" labelled 77 in FIG. 6 refers to the bond pad pitch of the set 50. This marking indicates that adjacent bond pads in this set are 4.5 mils apart from each other when measured from the center points of adjacent bond pads. Similarly, the marking "4 BPP" labelled 79 refers to the fact that group 52 comprising bond pad sets 60, 61 has a bond pad pitch of 4 mils.

The sector portion of the test die also includes at least one bond pad which is connected to ground (not shown) via the substrate in order to permit detection of cratering. To detect cratering, the voltage between the bond pad and the grounded pad is measured. In a non-cratered bond pad, the voltage usually lies between an experimentally determined range. If a crater is present, the voltage may lie outside of this range. If the voltage is detected to be outside of this range, the bonding wire and bond ball are removed by etching. The underlying bond pad is thereby exposed and may be viewed in order to confirm the existence of a crater, and to determine the extent of the cratering damage. The grounded bond pad thereby permits facile detection of the presence of craters.

Figure 7:
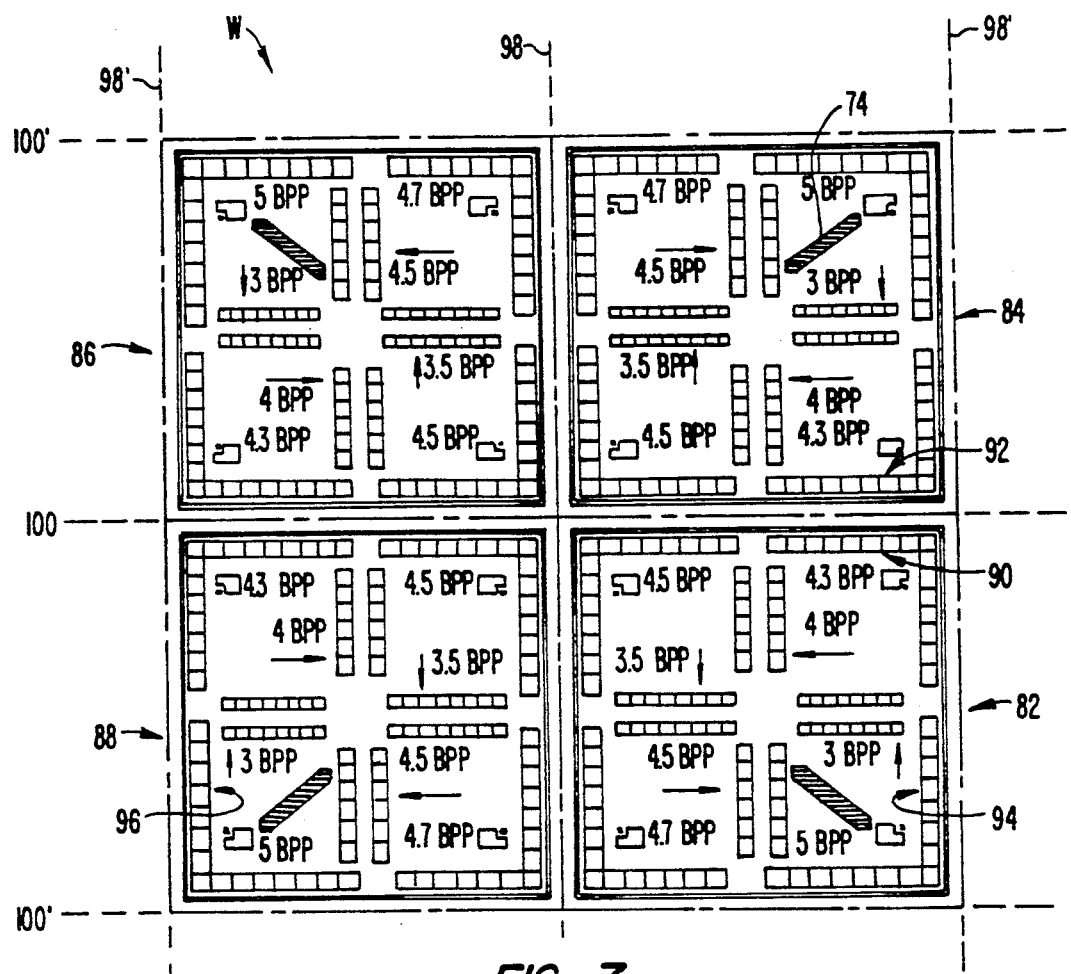
FIG. 7 is a plan view of a test die in accordance with the present invention.

FIG. 7 shows a test die 80 composed of the sector portion of the test die 40 of FIG. 6 and three of its mirror images which are arranged in two rows and two columns. The test die 80 is four times as large as the sector portion of the test die 40 of FIG. 6. Test die 80 is composed of four sectors 82, 84, 86, 88 which are arranged in two rows and two columns so that the bond pads of each of the four sectors will be symmetrically positioned with respect to the bond pads of an adjacent sector. More specifically, the set of bond pads 90 of sector 82 has the same bond pad pitch as and is a mirror image of the set of bond pads 92 of sector 84. Similarly, the set of bond pads 94 of sector 82 has the same bond pad pitch as and is a mirror image of the set of bond pads 96 of sector 88. The four sectors are mirror images of one another about lines 98 and 100.

Figure 8:
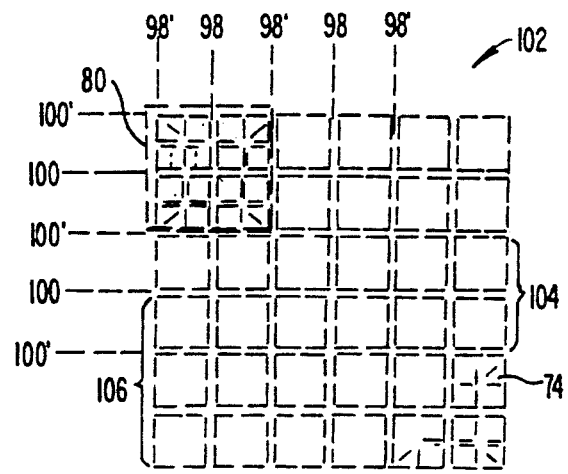
FIG. 8 is a plan view of a portion of a wafer suitable for dicing into various combinations of test die in accordance with the present invention.

FIG. 8 illustrates a portion 102 of a wafer having a plurality of sector patterns which may be cut from the wafer to be used as test dies. The configuration of the smallest unit of the present invention is test die 80 which is the smallest test die that may be cut from the wafer. A user may section off any portion of the wafer in order to produce a test die having a size and shape suitable for the assembly or wafer sort equipment to be tested.

Since the sector portion of the test die has four different bond pad pitches, a user may form a test die of any desired size having up to four different bond pad pitches on the corners of the test die. For example, a user may choose to section off a die 104 along two of the three lines 100' from the portion 102 of a wafer, or may choose to section off a larger die 106 from the wafer along the bottom one of lines 100. The configuration of the wafer advantageously permits selective separation of a die into different sizes depending on the needs of the user, whereas the prior art would require use of separate dies for each bond pad pitch. Note that identification markers 74 facilitate identification of individual units of the test die, a feature which is useful during a wafer saw operation.

Method for Evaluating a Semiconductor Assembly Machine or Process

A method for evaluating a semiconductor assembly machine includes the step of fabricating a semiconductor wafer which has a plurality of sectors which form a pattern (e.g. sectors 82–88 in FIG. 7), each pattern potentially functioning as a die. Each sector has a plurality of bond pads which may be arranged according to the test die described above, but is not limited to that configuration. The bond pads are additionally arranged so that a repeating pattern is formed on the wafer. In the case of the test die of the present invention, a repeating pattern occurs in blocks (e.g. 80 of FIGS. 7 and 8) of four sectors.

A desirable pattern of sectors which will form a size appropriate for the assembly or wafer sort machine to be evaluated is then identified. For example, if a test die comprised of the four sectors as shown in FIG. 7 is desired, a user would choose which bond pad pitch is to be on the perimeter of the die. If the test die 80 having a bond pad pitch of 5 mils is desired on the upper left corner of a four sector die, a die would be cut having sector 86 in the upper left corner. More specifically, wafer 102 would be cut along two adjacent lines 98' having one line 98 in between, and along two adjacent lines 100' having one line 100 in between. The resulting die 80 having sector 86 in the upper left corner, sector 84 in the upper right corner, sector 88 in the lower left corner, and sector 82 in the lower right corner, would be formed, as shown in FIG. 8. Alternatively, if a test die having a 4.7 mil bond pad pitch on the upper left corner is desired, sector 84 would be the upper left sector of a four sector die. A user would then cut the wafer 102 along two adjacent lines 98 having one line 98' in between, and two adjacent lines 100' having one line 100 in between. In this manner, a user may form a die having any bond pad pitch on all four corners by means of a standard wafer saw operation.

After reading and understanding the foregoing inventive test die and method for evaluating a semiconductor assembly machine, in conjunction with the drawings, it will be appreciated that several distinct advantages of the subject invention are obtained.

Without attempting to set forth all of the desirable features of the instant invention, at least some of the major advantages of the invention include the use of different bond pad pitches on a single test die which obviates the need for dedicating a separate wafer to test each bond pad pitch. Similarly, the use of different array bond pad pitches provides an additional amount of efficiency in testing an assembly or wafer sort machine.

The use of electrical connections permits testing of the test die for open and short circuits and thereby gives an indication of the quality of the assembly machine. By connecting at least one bond pad to a ground source, detection of cratering is possible.

Since the bond pad patterns are arranged symmetrical to one another, a user may advantageously choose the test die size, while also choosing the bond pad pitch to be evaluated on the perimeter of the die. This flexibility permits a user to purchase a wafer and then alter it according to need, instead of purchasing multiple conventional test wafers of the prior art for testing a single assembly machine.

The method of evaluating a semiconductor assembly machine permits a user to efficiently employ a wafer or test die of the present invention. By cutting a wafer near a set of bond pads with a desired bond pad pitch, a user may produce a test die having a desired arrangement of bond pad pitches in order to evaluate bonding to the pads.

It should be noted that although the invention has been described with reference to specific embodiments, it should not be construed to be so limited. Those skilled in the art and familiar with the instant disclosure of the subject invention may recognize additions, deletions, modifications, substitutions and other changes which will fall within the purview of the subject invention and claims.

What is claimed is:

1. A test die for evaluating a wire bonding process for bonding a plurality of wires each having two ends to a plurality of bond pads of said die and to a plurality of leads of a lead frame, wherein each wire is bonded to a bond pad at one end and to a lead at the other end, or for evaluating a molding process for encapsulating said die and said plurality of wires bonded to said die, said test die having:
   at least two sets of bond pads, each set including at least three bond pads, the distance between the center points of two adjacent bond pads in each set being substantially the same for any two adjacent bond pads in each set, said distance being defined as the bond pad pitch of such set; and
   said at least two sets of bond pads having different bond pad pitches.

2. A test die as defined in claim 1, said die having a surface, wherein said test die is suitable for evaluating a wire bonding process for bonding said die to leads of a lead frame using wires or for evaluating a molding process for encapsulating said die, wherein some of the bond pads of at least one set are arranged on the surface of the die to form an angle different from 180 degrees, so that the integrity of wires used to bond the leads to the bond pads at or near the angle may be tested.

3. A test die as defined in claim 2 wherein the bond pads of said at least one set are positioned along two imaginary intersecting lines which are orthogonal to each other, such that the bond pads are arranged to form a 90 degree angle.

4. A test die as defined in claim 3 wherein at least one of said said two imaginary intersecting lines of each set is parallel to at least one of said two imaginary intersecting lines of any other set.

5. A test die for evaluating a wire bonding process for bonding a plurality of wires each having two ends to a plurality of bond pads of said die and to a plurality of leads of a lead frame, wherein each wire is bonded to a bond pad at one end and to a lead at the other end, or for evaluating a molding process for encapsulating said die and said plurality of wires bonded to said die, said test die comprising:
   a least two bond pads; and
   at least one shorting electrical connection between said two bond pads, said connection permitting external detection of open circuit conditions after said wire bonding process is performed.

6. A test die as defined in claim 5 having at least three bond pads being adjacent and being arranged in an ordered sequence including at least a first, a second and a third pad; and wherein said at least one electrical connection connects the first and third pads of the ordered sequence to permit external detection of open and short circuits.

7. A test die for evaluating a wire bonding process for bonding a plurality of wires each having two ends to a plurality of bond pads of said die and to a plurality of leads of a lead frame, wherein each wire is bonded to a bond pad at one end and to a lead at the other end, or for evaluating a molding process for encapsulating said die and said plurality of wires bonded to said die, said test die comprising a surface having bond pads on said surface, wherein:
   said bond pads form at least one pattern including two sectors which are substantially mirror images across an imaginary line on the surface;
   each sector includes at least two sets of bond pads, each set including a plurality of bond pads, each of said at least two sets of bond pads having at least three bond pads, the distance between the center points of two adjacent bond pads being substantially the same for any two adjacent bond pads in each set, said distance being defined as the bond pad pitch of such set; and
   said at least two sets of bond pads have different bond pad pitches.

8. The test die of claim 7, wherein each sector includes four sets of bond pads, the pads in said four sets being arranged to form a quadrilateral configuration with each set at or near one of the four corners of the configuration.

9. The test die of claim 8, wherein the pads in said four sets are arranged to form a rectangular or square configuration.

10. The test die of claim 8, wherein said four sets of bond pads have different bond pad pitches.

11. The test die of claim 7, wherein the at least one pattern formed by the pads on the surface includes four sectors arranged in two rows and two columns, wherein each row of two sectors is a mirror image of the remaining row across an imaginary line on the surface between the rows, and wherein each column of two sectors is a mirror image of the remaining column across an imaginary line on the surface between the columns.

12. The test die of claim 11, wherein each sector includes four sets of bond pads, the pads in said four sets forming a quadrilateral configuration with each set at or near one of the four corners of the configuration.

13. The test die of claim 12, wherein the pads in said four sets form a rectangular or square configuration.

14. The test die of claim 12, wherein said four sets of bond pads have different bond pad pitches.

15. The test die of claim 12, wherein the bond pads on the surface of the die form a plurality of said patterns, said patterns being arranged in an orderly array of rows and columns.

16. The test die of claim 15, wherein said die further includes an identification marker for identifying a particular sector of the pattern or a particular set in each sector.

17. The test die of claim 16, wherein said plurality of said patterns are arranged to permit said die to be cut by means of a saw operation into a rectangular or square unit having a plurality of said sectors being arranged in an even number of rows and columns.

18. The test die of claim 17, wherein said plurality of said patterns are arranged to permit said die to be cut by means of a saw operation into a square unit having a single square sector.

19. The test die of claim 17, wherein said plurality of said patterns are arranged to permit said die to be cut by means of a saw operation into a square unit having four sectors being arranged in two columns and two rows.

20. A method for evaluating a wire bonding process for bonding a plurality of wires each having two ends to a plurality of bond pads of said die and to a plurality of leads of a lead frame, wherein each wire is bonded to a bond pad at one end and to a lead at the other end, or for evaluating a molding process for encapsulating said die and said plurality of wires bonded to said die, said method employing a test die and comprising the steps of:

fabricating a semiconductor wafer having a surface and having a plurality of sectors, wherein each of said sectors has a plurality of bond pads being fabricated on the surface of said wafer, such that a repeating pattern of the bond pads is formed on said plurality of sectors, and each of said sectors is adjacent to another sector such that all of said sectors are arranged in an orderly pattern, wherein a first sector of said wafer has a bond pad pattern which is a mirror image of a second sector about an edge being adjacent to said first and second sectors, and each of said sectors further includes at least two sets of bond pads having at least two bond pads adjacent to one another, the distance between the center points of two adjacent bond pads in each set being substantially the same for any two adjacent body pads in each set, said distance being defined as the bond pad pitch of such set, each of said sets having a different bond pad pitch;

identifying a desirable pattern of said plurality of sectors to form a test die having a size appropriate for the testing needs of a user;

cutting the desirable pattern of sectors apart from said wafer by means of a wafer saw operation to form an appropriately sized test die, said test die having a plurality of sectors being arranged in a predetermined number of rows and columns and having a desired arrangement of bond pad pitches near its edges in order to evaluate bonding to such pads.

21. A semiconductor wafer comprising:

a plurality of bond pads forming a sector on a surface of said wafer, said sector being located in a quadrilateral area of said surface and divisible into at least two sets of bond pads having bond pad pitches which are the same within each set, but different between different sets; and wherein each of said at least two sets of bond pads of a sector is adjacent to a different corner of said quadrilateral area and includes two portions, each portion being aligned with an imaginary straight line which is transverse to that of said other portion and each of said imaginary straight lines being parallel to a different edge of said adjacent corner.

22. A semiconductor wafer as recited in claim 21 wherein the quadrilateral is a square or rectangle, said wafer further comprising:

additional sectors of bond pads forming mirror images of said sector across imaginary lines running along the edges of said square or rectangular area.

23. A semiconductor wafer as recited in claim 22 further comprising:

an identification mark formed adjacent to one of said sets of bond pads whose mirror image is formed along with said bond pad patterns across imaginary lines running along the edges of said square or rectangular area.

* * * * *